(12) United States Patent
You et al.

(10) Patent No.: US 7,160,776 B2
(45) Date of Patent: Jan. 9, 2007

(54) METHODS OF FORMING A GATE STRUCTURE OF A NON-VOLATILE MEMORY DEVICE AND APPARATUS FOR PERFORMING THE SAME

(75) Inventors: Young-Sub You, Gyeonggi-do (KR); Ki-Su Na, Gyeonggi-do (KR); Hun-Hyeoung Leam, Gyeonggi-do (KR); Woong Lee, Seoul (KR)

(73) Assignee: Samsung Electronics Co. Ltd. (KR)

( * ) Notice: Subject to any disclaimer, the term of this patent is extended or adjusted under 35 U.S.C. 154(b) by 41 days.

(21) Appl. No.: 11/145,454

(22) Filed: Jun. 3, 2005

(65) Prior Publication Data
US 2005/0277252 A1 Dec. 15, 2005

(30) Foreign Application Priority Data
Jun. 15, 2004 (KR) ...................... 10-2004-0043839

(51) Int. Cl.
*H01L 21/336* (2006.01)
(52) U.S. Cl. ............... 438/257; 438/265; 257/E21.176; 257/E21.179
(58) Field of Classification Search ................ 438/257, 438/265; 257/E21.176, E21.179
See application file for complete search history.

(56) References Cited

U.S. PATENT DOCUMENTS 6,288,419 B1* 9/2001 Prall et al. .................. 257/213
6,764,942 B1* 7/2004 Tu et al. ..................... 438/635
6,943,416 B1* 9/2005 Hu .............................. 257/412
2002/0137284 A1* 9/2002 Chang et al. ............... 438/257
2005/0045941 A1* 3/2005 Kurita et al. ............... 257/315

FOREIGN PATENT DOCUMENTS

| KR | 990057939 | 7/1999 |
| KR | 10-2000-0038209 | 7/2000 |
| KR | 1020000056496 | 9/2000 |
| KR | 1020040005330 | 1/2004 |

OTHER PUBLICATIONS

Notice to Submit a Response for Korean Patent Application No. 10-2004-004389 mailed on Nov. 30, 2005.

* cited by examiner

*Primary Examiner*—Trung Dang
(74) *Attorney, Agent, or Firm*—Myers Bigel Sibley & Sajovec

(57) ABSTRACT

Methods of forming a gate structure of a non-volatile memory device include forming a gate pattern having a control gate on a semiconductor substrate. An oxidation-preventing layer is formed on the control gate in a process chamber while maintaining a substantially oxygen free atmosphere in the process chamber. An oxide spacer is formed on a sidewall of the gate pattern with the oxidation-preventing layer thereon in the process chamber. Forming an oxidation-preventing layer may include exposing the gate pattern to a first gas in the process chamber and forming an oxide spacer may include exposing the gate pattern to a second gas including oxygen in the process chamber.

18 Claims, 6 Drawing Sheets

METHODS OF FORMING A GATE STRUCTURE OF A NON-VOLATILE MEMORY DEVICE AND APPARATUS FOR PERFORMING THE SAME

CROSS REFERENCE TO RELATED APPLICATION

This application is related to and claims priority under 35 USC § 119 from Korean Patent Application No. 2004-43839, filed on Jun. 15, 2004, the contents of which are hereby incorporated herein by reference in their entirety.

BACKGROUND OF THE INVENTION

The present invention relates to methods and apparatus for forming a gate structure and, more particularly, to methods and apparatus for forming a gate structure of a memory device.

Semiconductor memory devices may be classified as volatile memory devices, such as a dynamic random access memory (DRAM) and static random access memories (SRAMs), which generally lose data with the passage of time, and non-volatile memory devices, such as a flash memory, that generally continuously retain data regardless of the passage of time. The data typically may be rapidly input/output into/from a volatile memory device. On the other hand, the data may be more slowly input/output into/from a non-volatile memory device.

A non-volatile memory device may have a very large memory capacity. A memory cell of the non-volatile memory device may have a vertically stacked gate structure that includes a floating gate formed on a silicon substrate. A multi-layered gate structure may include a first dielectric layer, a floating gate, a second dielectric layer and a control gate. The memory cell may be programmed by moving hot channel electrons from a drain region to accumulate the electrons in the floating gate, thereby increasing a threshold voltage of a cell transistor. The memory cell may be erased by generating a high voltage between the substrate and the floating gate to discharge electrons in the floating gate, thereby decreasing the threshold voltage of the cell transistor.

The first dielectric layer may be referred to as a tunnel oxide layer. The floating gate may serve as a tunneling source in programming and erasing data. The floating gate may include doped polysilicon. The second dielectric layer generally preserves the data in the floating gate. The second dielectric layer may include an oxide/nitride/oxide (ONO) structure. The voltage is typically applied to the control gate to migrate the electrons in the substrate to the floating gate when programming the data or the electrons in the floating gate to the substrate when erasing the data. To reduce a resistance of the control gate, the control gate may include a polysilicon layer and a metal layer, such as a tungsten layer, formed on the polysilicon layer.

In a conventional method of forming a non-volatile memory device that includes the above-mentioned structure, the first dielectric layer is formed on the semiconductor substrate. The doped polysilicon layer is formed on the first dielectric layer. The second dielectric layer having the ONO structure is formed on the doped polysilicon layer. A polysilicon layer and a tungsten layer are sequentially formed on the second dielectric layer. The tungsten layer, the polysilicon layer, the second dielectric layer, the doped polysilicon layer and the first dielectric layer are patterned to form a gate pattern including a tungsten layer pattern, a polysilicon layer pattern, a second dielectric layer pattern, a doped polysilicon layer pattern and a first dielectric layer pattern. The tungsten layer pattern and the polysilicon layer pattern correspond to the control gate discussed above and the doped polysilicon layer pattern corresponds to the floating gate.

A spacer is typically formed on a sidewall of the gate pattern. As nitride has a high dielectric constant, a spacer including nitride may function as a parasitic capacitor. To limit or prevent the spacer from functioning as a parasitic capacitor, an oxide spacer having a dielectric constant lower than that of nitride may be formed on the sidewall of the gate pattern. A nitride spacer may then be formed on the oxide spacer.

However, when the oxide spacer is formed, tungsten may be reacted with oxygen so that whiskers grow from the tungsten layer pattern. The whiskers may interfere with electromigration during operation of the control gate. Therefore, in a process for forming a non-volatile memory device that has the control gate including tungsten, a process for preventing oxidation of the tungsten layer is generally carried out before forming the oxide spacer.

To prevent the oxidation of the tungsten layer, according to a conventional method, a nitrogen gas may be applied to the semiconductor substrate to form an oxidation-preventing layer on an outer wall of the tungsten layer, before the oxide spacer is formed. Also, as preventing the oxidation of the tungsten layer in applying the nitrogen gas to the semiconductor substrate may be required, a chamber in which the semiconductor substrate is positioned is typically maintained under an atmosphere free from oxygen.

However, the process for preventing the oxidation of the tungsten layer is typically performed on only one semiconductor substrate, not on a plurality of semiconductor substrates. As a batch type chamber generally has a large inner space into which semiconductor substrates are loaded, it may be difficult to form the atmosphere free from oxygen in the inner space of the batch type chamber. In particular, although a batch type chamber is typically exhausted using vacuum, oxygen may partially remain in the batch type chamber. As a result, the whiskers may partially grow from the tungsten layer when applying the nitrogen gas to the semiconductor substrate.

According to a conventional method, one semiconductor substrate is loaded into a single-substrate type chamber having a very small inner space compared to a batch chamber. The oxidation-preventing layer is then formed on the outer wall of the tungsten layer. Thus, the conventional method may be carried out on the semiconductor substrates one by one, in which case the time for forming the oxidation-preventing layer on the tungsten layer of all of the semiconductor substrates is generally lengthened. As a result, the conventional method may cause a decrease of yield for manufacturing the non-volatile memory device.

It is typically not necessary to perform the process for forming the oxide spacer on the gate structure having the oxidation-preventing layer on the semiconductor substrates one substrate at a time. Therefore, the semiconductor substrates are typically loaded into a deposition chamber. The process for forming the oxide spacer is collectively carried out on the batch of semiconductor substrates in the deposition chamber. That is, the process for forming the oxidation-preventing layer and the process for forming the oxide spacer are generally separately performed in two different chambers, which may render the conventional method very complicated.

In addition, the substrate having the oxide spacer is generally transferred to another deposition chamber in which the process for forming the nitride spacer is carried out. As a result, to form the gate structure of the non-volatile memory device in accordance with such a conventional method, the chamber for forming the oxidation-preventing layer, the chamber for forming the oxide spacer and the chamber for forming the nitride layer are typically required to be separate chambers.

SUMMARY OF THE INVENTION

Embodiments of the present invention include methods of forming a gate structure of a non-volatile memory device. A gate pattern having a control gate is formed on a semiconductor substrate. An oxidation-preventing layer is formed on the control gate in a process chamber while maintaining a substantially oxygen free atmosphere in the process chamber. An oxide spacer is formed on a sidewall of the gate pattern with the oxidation-preventing layer thereon in the process chamber. Forming an oxidation-preventing layer may include exposing the gate pattern to a first gas in the process chamber and forming an oxide spacer may include exposing the gate pattern to a second gas including oxygen in the process chamber.

In other embodiments of the present invention, the process chamber is a batch process chamber. Placing the semiconductor substrate in the process chamber includes placing a plurality of semiconductor substrates in the process chamber concurrently and concurrently forming an oxidation-preventing layer on the gate pattern of each of the plurality of semiconductor substrates. Forming an oxide spacer includes concurrently forming oxide spacers on sidewalls of the gate patterns of each of the plurality of semiconductor substrates in the process chamber.

In further embodiments of the present invention, forming the gate pattern includes forming a tunnel oxide layer on the semiconductor substrate, forming a floating gate on the tunnel oxide layer, forming a dielectric layer on the floating gate and forming the control gate on the dielectric layer. Forming the control gate may include forming a polysilicon layer pattern on the dielectric layer and forming a metal layer pattern on the polysilicon layer pattern. The metal layer pattern may be tungsten.

In other embodiments of the present invention, the first gas is an ammonia gas. Exposing the gate pattern to a first gas may include exposing the gate pattern to the ammonia gas at a temperature of about 700° C. to about 800° C. under a pressure of about 0.2 Torr to about 0.4 Torr for at least about 30 seconds. The second gas may be a nitrous oxide ($N_2O$) gas and a dichlorosilane (DCS) gas and exposing the gate pattern to a second gas may include exposing the gate pattern to the $N_2O$ gas and the DCS gas at a temperature of about 700° C. to about 800° C. under a pressure of about 0.2 Torr to about 0.4 Torr for at least about 50 minutes. Exposing the gate pattern to the $N_2O$ gas and the DCS gas may include first exposing the gate pattern to the $N_2O$ gas for at least about 30 seconds and then exposing the gate pattern to the DCS gas.

In yet further embodiments of the present invention, forming an oxide spacer is followed by forming a nitride spacer on the oxide spacer in the process chamber. Forming a nitride spacer may include exposing the gate pattern to a third gas including an ammonia gas and a dichlorosilane (DCS) gas in the process chamber. Exposing the gate pattern to the third gas may include exposing the gate pattern to the ammonia gas and the DCS gas at a temperature of about 700° C. to about 800° C. under a pressure of about 0.2 Torr to about 0.4 Torr for at least about 50 minutes. Exposing the gate pattern to the ammonia gas and the DCS gas may include first exposing the gate pattern to the ammonia gas for at least about 30 seconds and then exposing the gate pattern to the DCS gas.

In other embodiments of the present invention, methods of forming a gate structure of a non-volatile memory device include forming a tunnel oxide layer on a semiconductor substrate. A floating gate is formed on the tunnel oxide layer. A dielectric layer is formed on the floating gate. A control gate, including a polysilicon layer pattern and a tungsten layer pattern, is formed on the dielectric layer. An oxidation-preventing layer is formed on the tungsten layer pattern in a batch process chamber under an atmosphere substantially free of oxygen. An oxide spacer is formed on sidewalls of the tunnel oxide layer, the floating gate, the dielectric layer and the control gate in the batch process chamber and a nitride spacer is formed on the oxide spacer in the batch process chamber.

In further embodiments of the present invention, forming an oxidation-preventing layer includes applying a first gas to the semiconductor substrate and forming an oxide spacer includes applying a second gas including oxygen to the substrate and forming a nitride spacer includes applying a third gas including nitrogen to the substrate. The first gas may be an ammonia gas, the second gas may be an $N_2O$ gas and a dichlorosilane (DCS) gas and the third gas may be an ammonia gas and a dichlorosilane (DCS) gas.

In yet other embodiments of the present invention, an apparatus for forming a gate structure of a non-volatile memory device includes a process chamber configured to receive a plurality of semiconductor substrates on which respective gate patterns having a control gate are formed. A loadlock chamber of the apparatus is configured to provide vacuum to the process chamber. A first input line couples the process chamber to a first gas used for forming an oxidation-preventing layer on the gate patterns in the process chamber and a second input line couples the process chamber to a second gas used for forming an oxide spacer on a sidewall of the gate pattern in the process chamber. A vacuum line provides vacuum to the loadlock chamber and a purge line provides a purge gas to the process chamber and/or the loadlock chamber. A third input line may be provided that couples the process chamber to a third gas used for forming a nitride spacer on the oxide spacer in the process chamber.

BRIEF DESCRIPTION OF THE DRAWINGS

The above and other features and advantages of the invention will become readily apparent by reference to the following detailed description when considered in conjunction with the accompanying drawings wherein.

DETAILED DESCRIPTION OF THE INVENTION

Figure 1:
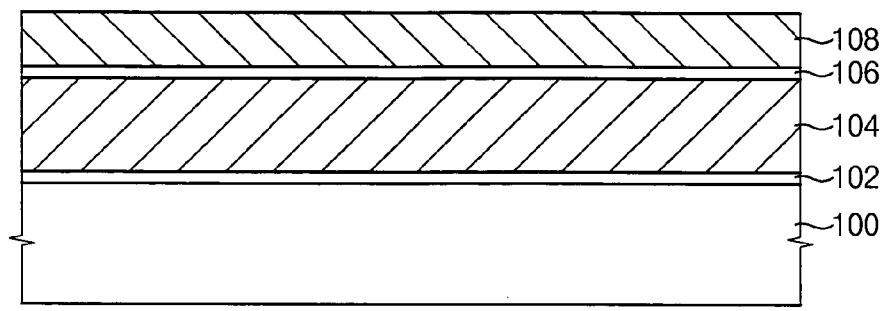
FIGS. 1 to 6 are cross sectional views illustrating methods of forming a gate structure of a non-volatile memory device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on", "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numbers refer to like elements throughout. As used herein, the term "and/or" includes any and all combinations of one or more of the associated listed items.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Various embodiments of the present invention will now be described with reference to the figures. FIGS. 1 to 6 are cross sectional views illustrating methods of forming a gate structure of a non-volatile memory device according to some embodiments of the present invention. Referring to FIG. 1, a semiconductor substrate 100 may include an active region and a field region separated by a shallow trench isolation (STI) process. In particular, the semiconductor substrate 100 may be partially etched to form a trench at a surface portion of the semiconductor substrate 100. An oxide layer may be formed on the semiconductor substrate 100 by, for example, a chemical vapor deposition (CVD) process, to fill the trench. The oxide layer may be removed by an etch-back process or a chemical mechanical polishing (CMP) process until the semiconductor substrate 100 is exposed to form a field oxide layer in the trench.

For example, the field region may be formed by a local oxidation of silicon (LOCOS) process or a self-aligned shallow trench isolation process. The active region and a floating gate may be formed by the self-aligned shallow trench isolation process.

As seen in the embodiments of FIG. 1, first dielectric layer 102, which may have a thickness of about 50 Å to about 100 Å, is formed on the semiconductor substrate 100 by, for example, a thermal oxidation process. The first dielectric layer 102 may be a silicon oxide layer, a silicon oxynitride layer and/or the like.

A first silicon layer 104, which may have a thickness of about 250 Å to about 350 Å, is illustrated formed on the first dielectric layer 102. The first silicon layer 104 may be patterned into the floating gate by successive processes. The first silicon layer 104 may include polysilicon, amorphous silicon and/or the like.

In the embodiments of FIG. 1, a second dielectric layer 106 is formed on the first silicon layer 104. The second dielectric layer 106 may include a first oxide layer, a nitride layer and a second oxide layer (ONO layer). In some embodiments, the first oxide layer may have a thickness of about 40 Å to about 50 Å, the nitride layer may have a thickness of about 65 Å to about 75 Å, and the second oxide layer may have a thickness of about 65 Å to about 75 Å. The ONO layer may be formed by a thermal oxidation process and/or a CVD process.

As seen in the embodiments of FIG. 1, a second silicon layer 108, which may have a thickness of about 250 Å to about 350 Å, is formed on the second dielectric layer 106. The second silicon layer 108 may be used to form a portion of a control gate. The second silicon layer 108 may include polysilicon, amorphous silicon and/or the like.

Figure 2:
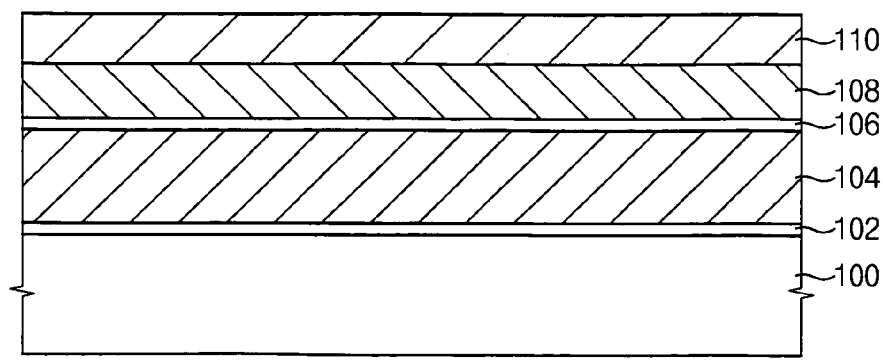

Referring now to the embodiments of FIG. 2, a metal layer 110, which may have a thickness of about 250 Å to about 350 Å, is formed on the second silicon layer 108. For example, the metal layer 110 may be tungsten. The metal layer 110 may also be used to form a portion of the control gate.

Figure 3:
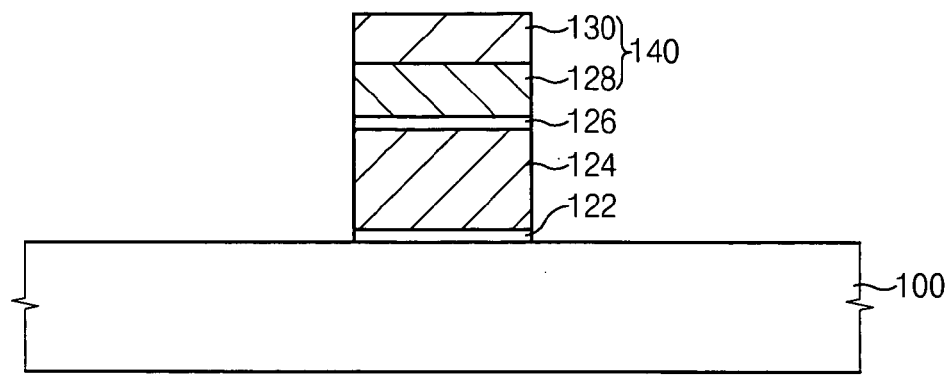

Referring next to the embodiments of FIG. 3, the metal layer 110, the second silicon layer 108, the second dielectric layer 106, the first silicon layer 104 and the first dielectric layer 102 are patterned, for example, by dry etching, to form a sequentially stacked gate pattern including a tunnel oxide layer 122, a floating gate 124, a dielectric layer 126 and a control gate 140.

The tunnel oxide layer 122 corresponds to an etched first dielectric layer pattern and the floating gate 124 corresponds to an etched first silicon layer pattern. The dielectric layer 126 corresponds to an etched second dielectric layer pattern and the control gate 140 corresponds to a stacked structure including an etched second silicon layer pattern 128 and a metal layer pattern 130.

Figure 4:
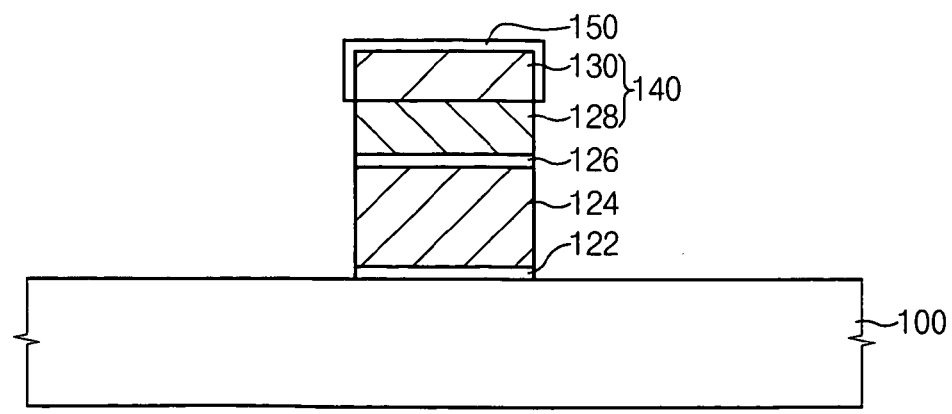

Referring now to the embodiments of FIG. 4, the semiconductor substrate 100 is loaded into a process chamber maintained under an atmosphere substantially free from oxygen. In some embodiments of the present invention, a first gas is introduced into the process chamber at a temperature of about 700° C. to about 800° C. under a pressure of about 0.2 Torr to about 0.4 Torr for no less than about 30 seconds at a flow rate of about 250 standard cubic centimeters per minute (sccm) to form an oxidation-preventing layer 150 on an upper face and a side face of the metal layer pattern 130 of the control gate 140. The oxidation-preventing layer may limit or even prevent oxidizing of the underlying metal layer pattern 130 as will be described further herein. The first gas may be, for example an ammonia ($NH_3$) gas. As such, the oxidation-preventing layer 150 may include nitride.

Figure 5:
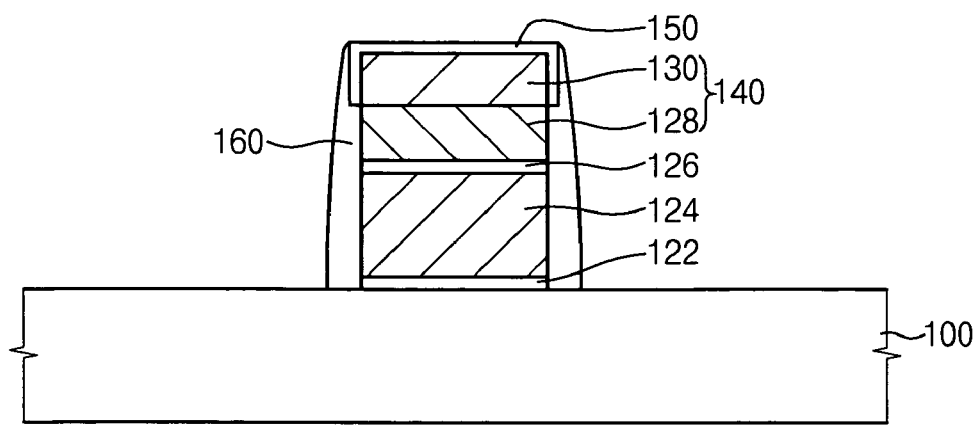

Referring now to the embodiments of FIG. 5, a second gas including oxygen is introduced into the process chamber to form an oxide spacer 160. In some embodiments, the second gas is introduced at a temperature of about 600° C. to about 700° C. under a pressure of about 0.2 Torr to about 0.4 Torr at a flow rate of about 150 sccm to form the oxide spacer 160 on a sidewall of the gate pattern.

In some embodiments, the oxide spacer 160 is formed in-situ in the same process chamber as where the oxidation-preventing layer 150 is formed, without the semiconductor substrate 100 being transferred between process chambers. Because the oxidation-preventing layer 150 in the illustrated embodiments encloses the metal layer pattern 130, when forming the oxide spacer 160, whiskers may not grow from the metal layer pattern 130.

In some embodiments, the second gas includes a nitrous oxide ($N_2O$) gas and a dichlorosilane ($DCS:SiH_2Cl_2$) gas. The $N_2O$ gas may be introduced into the process chamber at a flow rate of about 150 sccm for about 3 minutes to form an oxygen atmosphere in the process chamber. The $N_2O$ gas and the DCS gas may then be introduced into the process chamber at a flow rate of about 150 sccm for no less than about 50 minutes in some embodiments.

Figure 6:
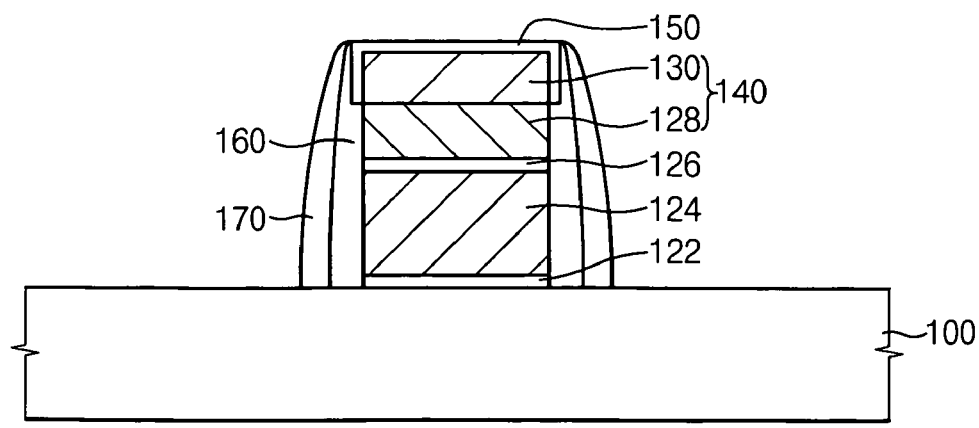

Referring to the embodiments of FIG. 6, a third gas, including nitrogen, may be introduced into the process chamber to form a nitride spacer 170. In some embodiments, the third gas is introduced into the process chamber at a temperature of about 700° C. to about 800° C. under a pressure of about 0.2 Torr to about 0.4 Torr for no less than about 50 minutes to form the nitride spacer 170 on the oxide spacer 160.

The third gas may include an ammonia gas and/or a DCS gas. The ammonia gas may be introduced into the process chamber for about 3 minutes to form a nitrification atmosphere in the process chamber. The ammonia gas and the DCS gas may then be introduced into the process chamber.

According to some embodiments, the process for forming the oxidation-preventing layer 150 and the processes for forming the oxide and nitride spacers 160 and 170 are carried out in-situ in a single process chamber. The above-mentioned three processes may be performed in-situ in the same chamber in a batch manner on a plurality of semiconductor substrates 100 in one process chamber.

Figure 7:
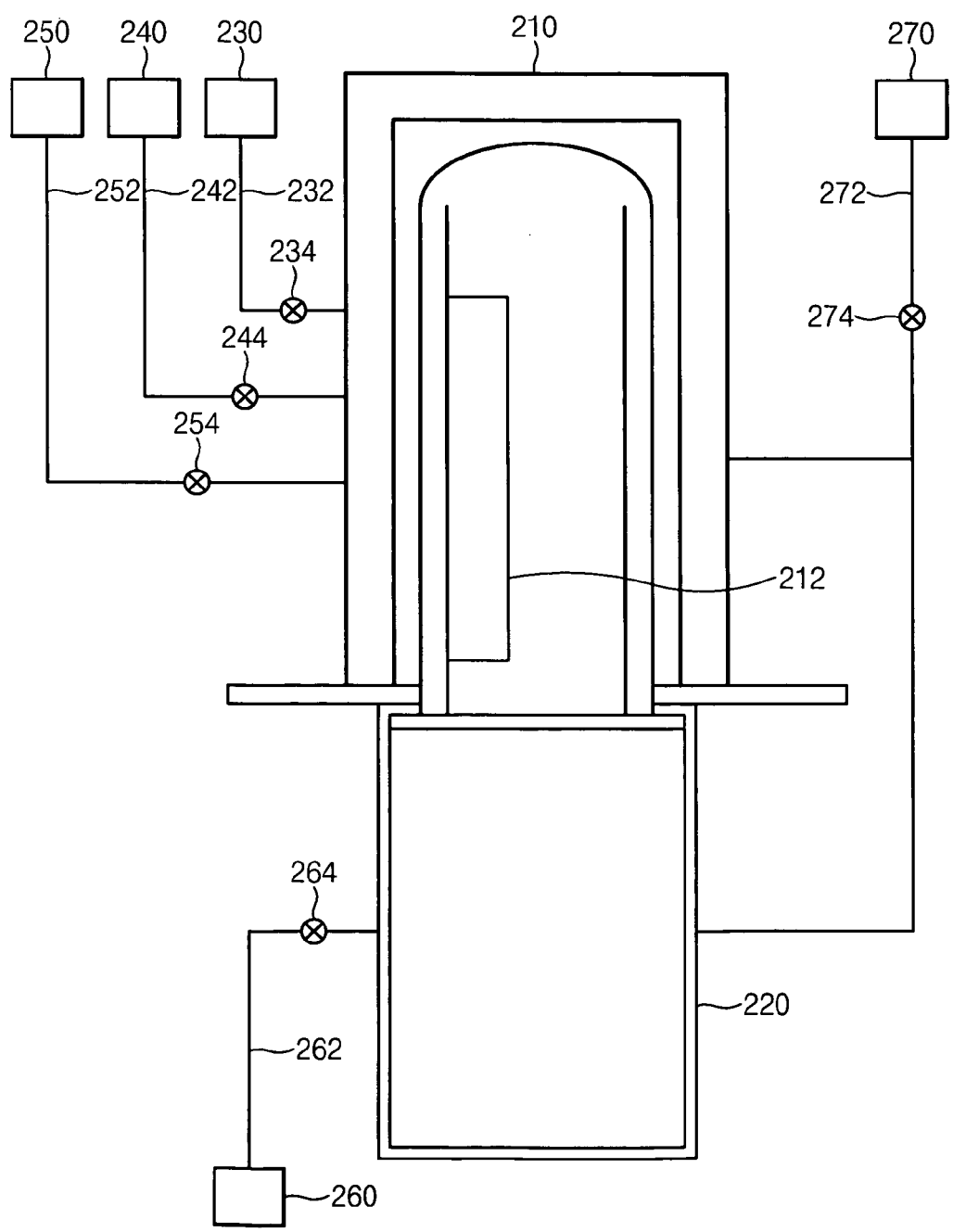
FIG. 7 is a cross sectional view illustrating an apparatus for forming a gate structure of a non-volatile memory device according to some embodiments of the present invention.

FIG. 7 is a cross sectional view illustrating an apparatus for forming a gate structure of a non-volatile memory device according to some embodiments of the present invention. As shown in the embodiments of FIG. 7, an apparatus 200 for forming a gate structure of a non-volatile memory device includes a process chamber 210 and a loadlock chamber 220 connected to a lower face of the process chamber 210.

The process chamber 210 may be a vertical furnace. A cassette 212, in which a plurality of semiconductor substrates may be received, is shown loaded into the process chamber 210. The loadlock chamber 220 may be configured to provide vacuum to the process chamber 210.

A first line 232 is illustrated having one end connected to the process chamber 210 and an opposite end connected to a first vessel 230, which may contain an ammonia gas. A first gas including the ammonia gas, which may be used for forming an oxidation-preventing layer on a control gate, and a third gas including the ammonia gas, which may be used for forming a nitride spacer, may be introduced into the process chamber 210 through the first line 232. A first mass flow controller (MFC) 234 for controlling a flow (or mass flux) of the ammonia gas is illustrated mounted on the first line 232.

In general, the MFC 234 may include a passageway for passing a fluid therethrough, an inlet for introducing the fluid into the passageway, and an outlet for discharging the fluid from the passageway. A bypass for bypassing the fluid may be positioned in the passageway adjacent to the inlet. A sample line may be connected to the passageway. A mass flow sensor may be included that measures a mass flow of the fluid passing through the bypass. A control valve for controlling the mass flow of the fluid may be arrayed between the bypass and the outlet.

For the illustrated embodiments of FIG. 7, a second line 242 includes one end connected to the process chamber 210 and an opposite end connected to a second vessel 240, which may contain a DCS gas. A second gas, which may be used for forming an oxide spacer on a sidewall of a gate structure, and a third gas, which may be used for forming the nitride spacer on the oxide spacer, may be introduced into the process chamber 210 through the second line 242. A second MFC 244 for controlling a flow of the DCS gas is shown mounted on the second line 242.

Also shown in the embodiments of FIG. 7 is a third line 252 having one end connected to the process chamber 210 and an opposite end connected to a third vessel 250, which may contain an $N_2O$ gas. The $N_2O$ gas included in the second gas, which may be used for forming the oxide spacer, may be introduced into the process chamber 210 through the third line 252. A third MFC 254 for controlling a flow of the N$_2$O gas is shown mounted on the third line 252.

A vacuum line 262 is illustrated that includes one end connected to the loadlock chamber 220 and an opposite end connected to a vacuum pump 260. A fourth MFC 264 for controlling a flow of the vacuum is shown mounted on the vacuum line 262.

A purge line 272 is also shown for the embodiments of FIG. 7 having one end connected to both the process chamber 210 and the loadlock chamber 220, respectively, and an opposite end connected to a fourth vessel 270, which may contain a purge gas, such as a nitrogen gas. A fifth MFC 274 for controlling a flow of the nitrogen gas is shown mounted on the purge line 272.

A method of forming a gate structure of a non-volatile memory device using the above-mentioned apparatus 200 according to some embodiments of the present invention will now be further described with reference to FIGS. 3 to 7.

A plurality of semiconductor substrates 100 on which the gate patterns are formed as shown in FIG. 3 are loaded into the process chamber 210. The semiconductor substrates 100 in some embodiments are received in the cassette 212.

The process chamber is maintained, for example, at a temperature of about 650° C. under a pressure of about 0.3 Torr. The vacuum may be introduced into the loadlock chamber 220 through the vacuum line 262. Concurrently, nitrogen gas, which may have a volume of about 6.5 liters, is introduced into the process chamber 210 and the loadlock chamber 220 to purge the inner spaces of the process chamber 210 and the loadlock chamber 220, thereby forming an atmosphere substantially free from oxygen in the inner spaces of the process chamber 210 and the loadlock chamber 220. The process chamber 210 may then be heated, for example, to a temperature of about 780° C. The purge line 272 may be closed when providing vacuum to the loadlock chamber 220.

An ammonia gas having a flow of about 250 sccm may be provided to the process chamber 210 through the first line 232 to form the thin oxidation-preventing layer 150 on the outer face of the metal layer pattern 130, as shown in FIG. 4. The first line 232 may then be closed to block the supply of the ammonia gas.

An N$_2$O gas having a flow of about 150 sccm may then be introduced into the process chamber 210 through the third line 252 to form an oxygen atmosphere in the process chamber 210. As the oxidation-preventing layer 150 encloses the metal layer pattern 130, the growth of whiskers from the metal layer pattern 130 may be limited or even prevented when the N$_2$O gas is introduced.

A DCS gas having a flow of about 70 sccm may be supplied to the process chamber 210 through the second line 242, while the N$_2$O gas is continuously provided, to form the oxide spacer 160 on the sidewall of the gate pattern as illustrated in FIG. 5. The supplies of the DCS gas and the N$_2$O gas may be suspended.

An ammonia gas may be introduced into the process chamber 210 through the first line 232 to form a nitrogen atmosphere in the process chamber 210. The DCS gas may be provided to the process chamber 210 through the second line 242, while the ammonia gas is continuously supplied, to form the nitride spacer 170 on the oxide spacer 160 as illustrated in FIG. 6.

According to some embodiments, the process for forming the oxidation-preventing layer, the process for forming the oxide spacer and the process for forming the nitride spacer may be carried out in-situ in the same process chamber 210 without needing to move the substrate(s) 100 between chambers.

By way of further example, formation of a gate structure in accordance with particular embodiments of the present invention will now be further described. In particular, a tunnel oxide layer having a thickness of 70 Å is formed on a semiconductor substrate. A floating gate including polysilicon and having a thickness of 300 Å is formed on the tunnel oxide layer. An ONO layer that includes a first oxide layer having a thickness of 42 Å, a silicon nitride layer having a thickness of 70 Å and a second oxide layer having a thickness of 71 Å is formed on the floating gate. A tungsten layer having a thickness of 300 Å is formed on the polysilicon layer. A silicon nitride layer as a mask layer having a thickness of 1,500 Å is formed on the tungsten layer to complete a gate pattern including the above-mentioned layers.

A purge gas and vacuum are introduced into a process chamber at a temperature of 650° under a pressure of 0.3 Torr to form an atmosphere free from oxygen in the process chamber. The semiconductor substrates having the gate patterns, respectively, are loaded into the process chamber. The process chamber is then heated to a temperature of 780° C. An ammonia gas is introduced into the process chamber to form an oxidation-preventing layer on the tungsten layer. An N$_2$O gas and a DCS gas are introduced into the process chamber to form an oxide spacer on a sidewall of the gate pattern. The ammonia gas and the DCS gas are introduced into the process chamber to form a nitride spacer on the oxide spacer.

A gate pattern may be formed on a semiconductor substrate under substantially the same processing conditions but using a conventional method. In particular, the semiconductor substrates with the gate patterns are loaded into a process chamber. An N$_2$O gas and a DCS gas are introduced into the process chamber at a temperature of 780° under a pressure of 0.3 Torr to form an oxide spacer on a sidewall of the gate pattern. An ammonia gas and the DCS gas are introduced into the process chamber to form a nitride spacer on the oxide spacer. Scanning electron microscope (SEM) images of the respective gate structures will now be compared with reference to these particular examples.

Figure 8:
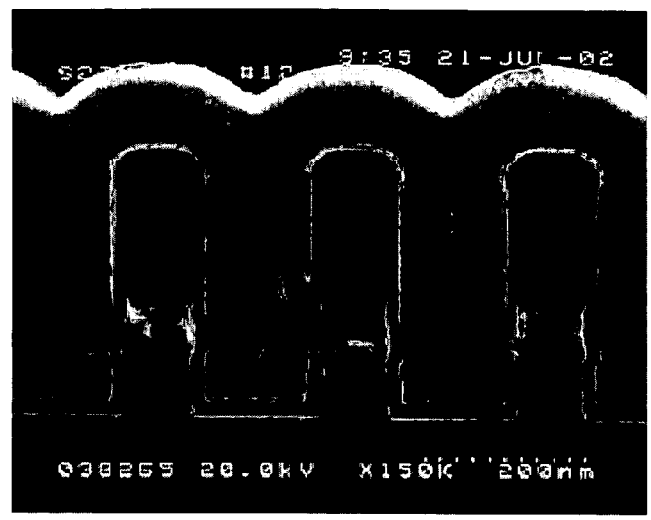
FIG. 8 is a scanning electron microscope (SEM) picture illustrating a cross section of a gate structure obtained using a conventional method.
Figure 9:
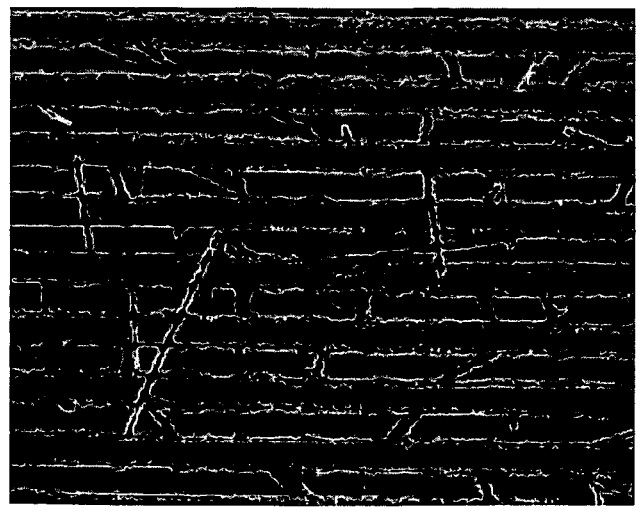
FIG. 9 is a scanning electron microscope (SEM) picture illustrating a plan section of a gate structure obtained using a conventional method.

FIG. 8 is a scanning electron microscope (SEM) picture illustrating a cross section of a gate structure obtained using a conventional method and FIG. 9 is a scanning electron microscope (SEM) picture illustrating a plan section of a gate structure obtained using a conventional method. As shown in FIGS. 8 and 9, it can be seen that numerous whiskers grow from the tungsten layer, without the oxidation-preventing layer, when forming the oxide spacer.

Figure 10:
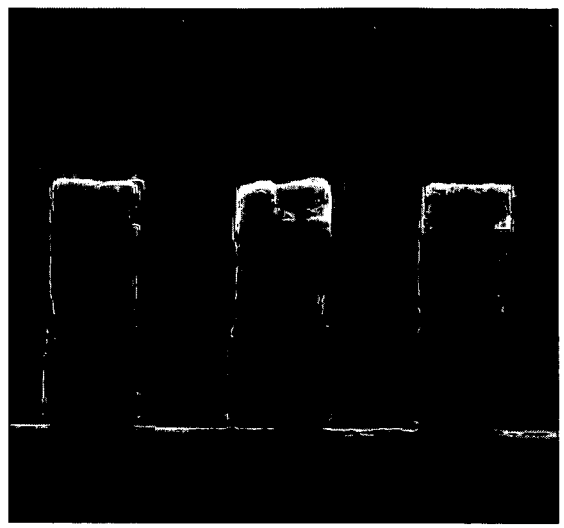
FIG. 10 is a scanning electron microscope (SEM) picture illustrating a cross section of a gate structure obtained using some embodiments of the present invention.
Figure 11:
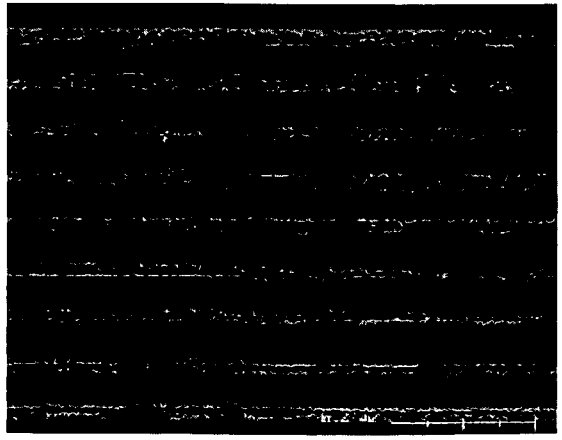
FIG. 11 is a scanning electron microscope (SEM) picture illustrating a plan section of a gate structure obtained using some embodiments of the present invention.

FIG. 10 is a scanning electron microscope (SEM) picture illustrating a cross section of a gate structure obtained using a method according to some embodiments of the present invention. FIG. 11 is a scanning electron microscope (SEM) picture illustrating a plan section of a gate structure obtained using a method according to some embodiments of the present invention. As shown in FIGS. 10 and 11, it can be seen that whiskers do not grow from the tungsten layer, covered by the oxidation-preventing layer, when forming the oxide spacer.

According to some embodiments of the present invention, the process for forming the oxidation-preventing layer, the process for forming the oxide spacer and the process for forming the nitride spacer may be carried out in-situ in a single chamber. Thus, the process for forming the gate structure of the non-volatile memory device may be simple so that the cost and time for manufacturing the non-volatile memory device may be significantly reduced.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. In the claims, means-plus-function clauses are intended to cover the structures described herein as performing the recited function and not only structural equivalents but also equivalent structures. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims. The invention is defined by the following claims, with equivalents of the claims to be included therein.

What is claimed is:

1. A method of forming a gate structure of a non-volatile memory device, the method comprising:
    forming a gate pattern having a control gate on a semiconductor substrate;
    forming an oxidation-preventing layer on the control gate in a process chamber while maintaining a substantially oxygen free atmosphere in the process chamber;
    forming an oxide spacer on a sidewall of the gate pattern with the oxidation-preventing layer thereon in the process chamber.

2. The method of claim 1, wherein forming an oxidation-preventing layer includes exposing the gate pattern to a first gas in the process chamber and wherein forming an oxide spacer includes exposing the gate pattern to a second gas including oxygen in the process chamber.

3. The method of claim 2 wherein the process chamber comprises a batch process chamber and wherein the semiconductor substrate comprises a plurality of semiconductor substrates with gate patterns thereon concurrently positioned in the process chamber and wherein forming an oxidation preventing layer comprises concurrently forming an oxidation preventing layer on the gate pattern of each of the plurality of semiconductor substrates and wherein forming an oxide spacer comprises concurrently forming oxide spacers on sidewalls of the gate patterns of each of the plurality of semiconductor substrates.

4. The method of claim 2, wherein forming the gate pattern comprises:
    forming a tunnel oxide layer on the semiconductor substrate;
    forming a floating gate on the tunnel oxide layer;
    forming a dielectric layer on the floating gate; and
    forming the control gate on the dielectric layer.

5. The method of claim 4, wherein forming the control gate comprises:
    forming a polysilicon layer pattern on the dielectric layer; and
    forming a metal layer pattern on the polysilicon layer pattern.

6. The method of claim 5, wherein the metal layer pattern comprises tungsten.

7. The method of claim 2, wherein the first gas comprises an ammonia gas.

8. The method of claim 7, wherein exposing the gate pattern to a first gas comprises exposing the gate pattern to the ammonia gas at a temperature of about 700° C. to about 800° C. under a pressure of about 0.2 Torr to about 0.4 Torr for at least about 30 seconds.

9. The method of claim 2, wherein the second gas comprises a nitrous oxide ($N_2O$) gas and a dichlorosilane (DCS) gas.

10. The method of claim 9, wherein exposing the gate pattern to a second gas comprises exposing the gate pattern to the $N_2O$ gas and the DCS gas at a temperature of about 700° C. to about 800° C. under a pressure of about 0.2 Torr to about 0.4 Torr for at least about 50 minutes.

11. The method of claim 9, wherein exposing the gate pattern to the $N_2O$ gas and the DCS gas comprises:
    first exposing the gate pattern to the $N_2O$ gas for at least about 30 seconds; and then exposing the gate pattern to the DCS gas.

12. The method of claim 2, wherein forming an oxide spacer is followed by forming a nitride spacer on the oxide spacer in the process chamber.

13. The method of claim 12, wherein forming a nitride spacer includes exposing the gate pattern to a third gas comprising an ammonia gas and a dichlorosilane (DCS) gas in the process chamber.

14. The method of claim 13, wherein exposing the gate pattern to the third gas comprises exposing the gate pattern to the ammonia gas and the DCS gas at a temperature of about 700° C. to about 800° C. under a pressure of about 0.2 Torr to about 0.4 Torr for at least about 50 minutes.

15. The method of claim 14, wherein exposing the gate pattern to the ammonia gas and the DCS gas comprises:
    first exposing the gate pattern to the ammonia gas for at least about 30 seconds; and then
    exposing the gate pattern to the DCS gas.

16. A method of forming a gate structure of a non-volatile memory device, the method comprising:
    forming a tunnel oxide layer on a semiconductor substrate;
    forming a floating gate on the tunnel oxide layer;
    forming a dielectric layer on the floating gate;
    forming a control gate including a polysilicon layer pattern and a tungsten layer pattern on the dielectric layer;
    forming an oxidation-preventing layer on the tungsten layer pattern in a batch process chamber under an atmosphere substantially free of oxygen;
    forming an oxide spacer on sidewalls of the tunnel oxide layer, the floating gate, the dielectric layer and the control gate in the batch process chamber; and
    forming a nitride spacer on the oxide spacer in the batch process chamber.

17. The method of claim 16, wherein forming an oxidation-preventing layer includes applying a first gas to the semiconductor substrate and wherein forming an oxide spacer includes applying a second gas including oxygen to the substrate and wherein forming a nitride spacer includes applying a third gas including nitrogen to the substrate.

18. The method of claim 17, wherein the first gas comprises an ammonia gas, the second gas comprises an $N_2O$ gas and a dichlorosilane (DCS) gas and wherein the third gas comprises an ammonia gas and a dichlorosilane (DCS) gas.

* * * * *